United States Patent
Yamaguchi et al.

(10) Patent No.: US 6,793,541 B2
(45) Date of Patent: Sep. 21, 2004

(54) CIRCUIT BOARD CONNECTOR WITH IMPROVED TERMINAL TAILS

(75) Inventors: Tomisaburo Yamaguchi, Yokohama (JP); Masanori Hayashi, Kanagawa (JP); Tomoaki Ito, Tokyo (JP)

(73) Assignee: Molex Incorporated, Lisle, IL (US)

( * ) Notice: Subject to any disclaimer, the term of this patent is extended or adjusted under 35 U.S.C. 154(b) by 0 days.

(21) Appl. No.: 10/266,659

(22) Filed: Oct. 8, 2002

(65) Prior Publication Data

US 2003/0082938 A1 May 1, 2003

(30) Foreign Application Priority Data

Oct. 24, 2001 (JP) ........................................ 2001-326158

(51) Int. Cl.[7] ............................................. H01R 13/42
(52) U.S. Cl. ...................................... 439/751; 439/567
(58) Field of Search .......................... 439/82, 751, 567

(56) References Cited

U.S. PATENT DOCUMENTS

| | | | | |
|---|---|---|---|---|
| 4,129,351 A | * | 12/1978 | Sugimoto et al. | 439/325 |
| 4,353,609 A | * | 10/1982 | Haas | 439/82 |
| 4,377,321 A | * | 3/1983 | Weisenburger | 439/872 |
| 5,076,804 A | * | 12/1991 | Bertho et al. | 439/567 |
| 5,366,381 A | * | 11/1994 | Kile | 439/79 |
| 5,411,404 A | * | 5/1995 | Korsunsky et al. | 439/108 |
| 6,634,893 B1 | * | 10/2003 | Korsunsky et al. | 439/82 |

FOREIGN PATENT DOCUMENTS

| | | |
|---|---|---|
| JP | 4-163864 | 6/1992 |
| JP | 8-293339 | 11/1996 |

* cited by examiner

*Primary Examiner*—Hae Moon Hyeon
(74) *Attorney, Agent, or Firm*—Stephen Z. Weiss

(57) ABSTRACT

An electrical connector for mounting on a printed circuit board having a plurality of through holes includes a dielectric housing. A plurality of conductive terminals are mounted on the housing. Each terminal includes a tail portion for passing through a selected one of the through holes in the printed circuit board. Each tail portion has a first side and a latch hook projecting from a second side opposite the first side. The width of the tail portion between the first side and a tip of the latch hook is less than a diameter of the selected through hole. Each solder tail portion can be inserted from one side of the printed circuit board through the selected hole with minimum insertion forces, with the latch hook being engageable with an opposite side of the printed circuit board.

5 Claims, 2 Drawing Sheets

CIRCUIT BOARD CONNECTOR WITH IMPROVED TERMINAL TAILS

FIELD OF THE INVENTION

This invention generally relates to the art of electrical connectors and, particularly, to a connector for mounting on a printed circuit board, the connector having solder tails with improved latching configurations.

BACKGROUND OF THE INVENTION

FIG. 8 shows a conventional electrical connector, generally designated 10, designed for mounting on a top or front side 12a of a printed circuit board 12. A connector includes a dielectric housing, generally designated 14, which mounts a plurality of conductive terminals, generally designated 16. The terminals have solder tail portions 18 which extend through selected holes 20 in the circuit board. The solder tails are soldered, as at 22, to appropriate circuit traces on a bottom or rear side 12b of the circuit board. The connector may include hold-down members 24 at opposite ends thereof (only one end being shown in the drawing) for securing the connector to the circuit board.

Problems are encountered in soldering terminal tail portions 18 to the circuit board. Specifically, during soldering, the circuit board is heated at such an elevated temperature that it may become bent as shown in FIG. 8, leaving a space or gap 26 between the connector housing and the board. As a result, some of the solder tails may be pulled away from the circuit board and their associated circuit traces, effectively peeling the printed circuit off of the circuit board.

Attempts have been made to solve these problems as shown in Japan Patent Applications Laid-Open No. 4-163864 and No. 8-293339. In those disclosures, the soldering tails are slit and bent to define latch sections on opposite sides thereof, or the terminal is stamped out of spring metal material and a resilient latch tongue is formed on one side thereof. In either system, a strong force is required to insert the soldering tails into and through the holes in the circuit board. These insertion forces increase with the ever-increasing density of the connector requiring increasing numbers of terminals, and, therefore, it is difficult if not impossible to insert plural tails simultaneously through holes in the circuit board. The present invention is directed to solving these problems by an improved solder tail configuration.

SUMMARY OF THE INVENTION

An object, therefore, of the invention is to provide a new and improved electrical connector for mounting on a printed circuit board having a plurality of through holes.

Another object of the invention is to provide a new and improved tail configuration for the solder tails of such a connector.

In the exemplary embodiment of the invention, the connector includes a dielectric housing having a plurality of conductive terminals mounted thereon. Each terminal includes a tail portion for passing through a selected one of the through holes in the printed circuit board. Each tail portion has a first side and a latch hook projecting from a second side opposite the first side. The width of the tail portion between the first side and a tip of the latch hook is less than a diameter of the selected through hole. Therefore, each solder tail can be inserted from one side of the printed circuit board through the selected through hole with minimum insertion forces, and with the latch hook being engageable with an opposite side of the printed circuit board.

According to one aspect of the invention, the latch hook has an angled leading surface for guiding the respective tail portion into the selected through hole. An abrupt latch surface is provided behind the angled leading surface for engaging the opposite side of the printed circuit board.

According to another aspect of the invention, a given pair of the terminals have tail portions with latch hooks directed toward each other. These facing latch hooks can be provided in a single row of terminals.

According to a further aspect of the invention, the tail portions of the terminals have biasing projections at the first sides of the terminals. The biasing projections are spaced from the latch hooks for engaging the insides of the through holes and biasing the latch hooks into engagement with the opposite side of the printed circuit board when the latch hooks clear the through holes.

Other objects, features and advantages of the invention will be apparent from the following detailed description taken in connection with the accompanying drawings.

BRIEF DESCRIPTION OF THE DRAWINGS

The features of this invention which are believed to be novel are set forth with particularity in the appended claims. The invention, together with its objects and the advantages thereof, may be best understood by reference to the following description taken in conjunction with the accompanying drawings, in which like reference numerals identify like elements in the figures and in which:

DETAILED DESCRIPTION OF THE PREFERRED EMBODIMENT

Figure 1:
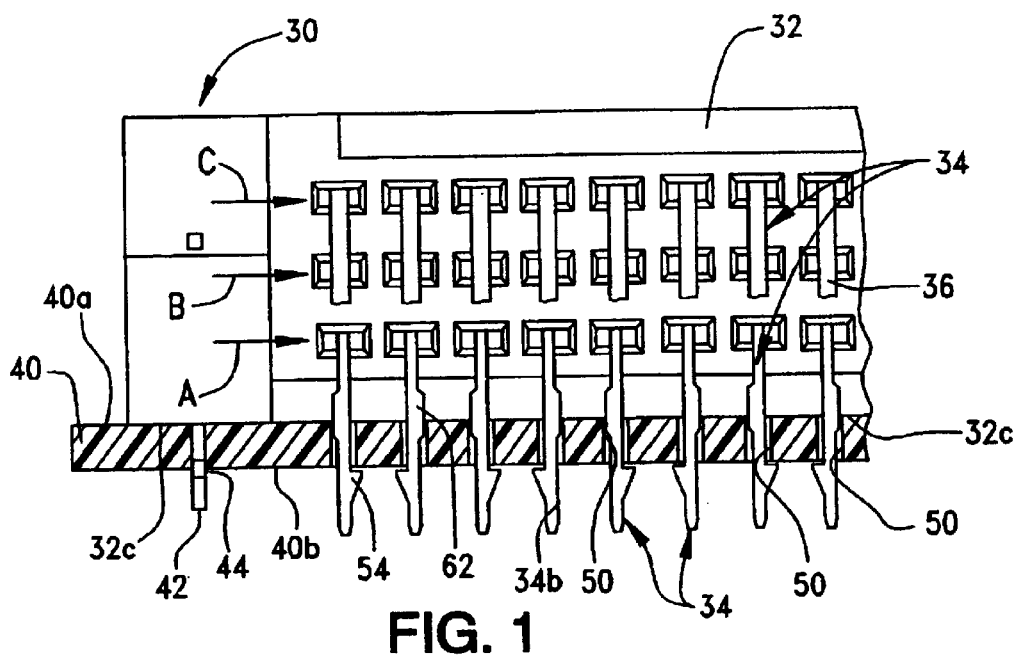
FIG. 1 is an enlarged, fragmented elevational view of the rear terminating face of an electrical connector according to the invention.

Referring to the drawings in greater detail, and first to FIGS. 1–4, the invention is embodied in an electrical connector, generally designated 30, which includes an elongated dielectric housing 32 mounting a plurality of conductive terminals, generally designated 34. The terminals are mounted in the housing in three rows as indicated by arrows "A", "B" and "C" in FIG. 1. The connector is a right-angle connector, and housing 32 includes a rear terminating face 32a from which the three rows of terminals project and are bent downwardly at right angles as seen best in FIG. 3. The terminals have solder tails 36 bent at right angles to define horizontal contact pins 36a and vertically depending tail portions 36b.

Housing 32 of connector 30 has a front or mating side 32b which may include a receptacle 38 (FIG. 2) for receiving a complementary mating connector. The housing has a bottom surface 32c for positioning on a top or front side 40a of a printed circuit board 40. The circuit board has a bottom or rear side 40b. A pair of board-mounting members 42 are mounted in housing 32 for mounting in a pair of through holes 44 (FIG. 1) in circuit board 40. Two board-mounting members 42 are mounted in opposite ends of housing 32 as seen in FIG. 2. Vertical tail portions 36b of solder tails 36 of terminals 34 are mounted in through holes 50 in circuit board 40 as seen in FIG. 1.

Figure 2:
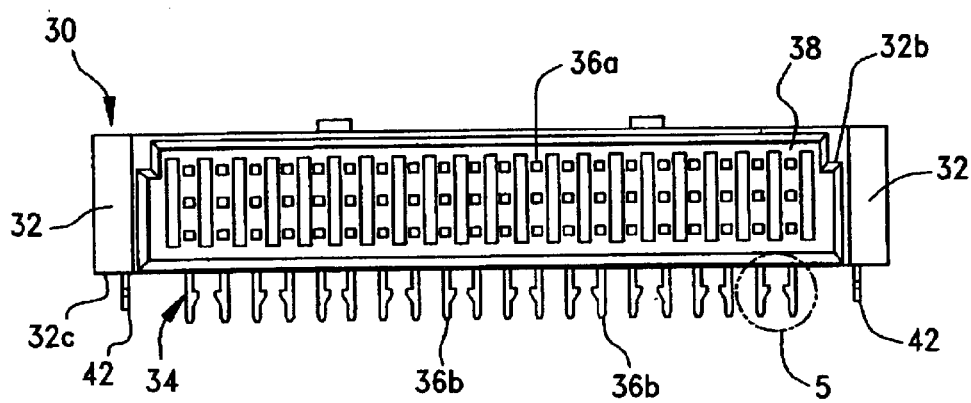
FIG. 2 is a front elevational view, on a reduced scale, of the entire connector.
Figure 3:
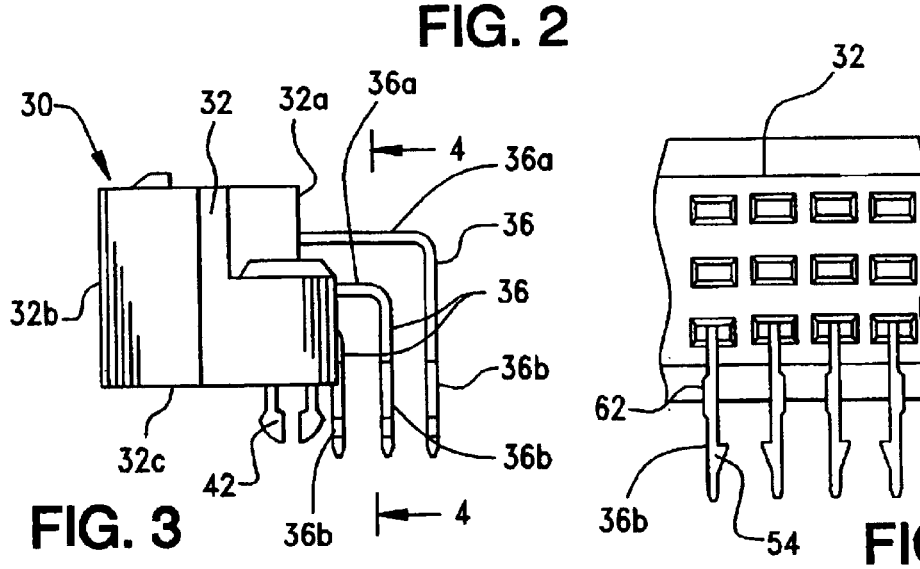
FIG. 3 is a side elevational view of the connector.
Figure 4:
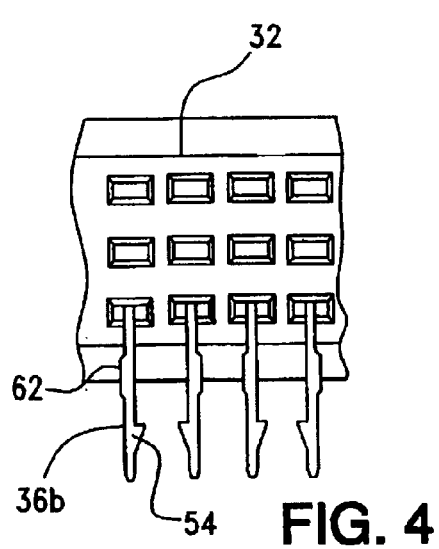
FIG. 4 is a fragmented vertical section taken generally along line 4—4 of FIG. 3.
Figure 5:
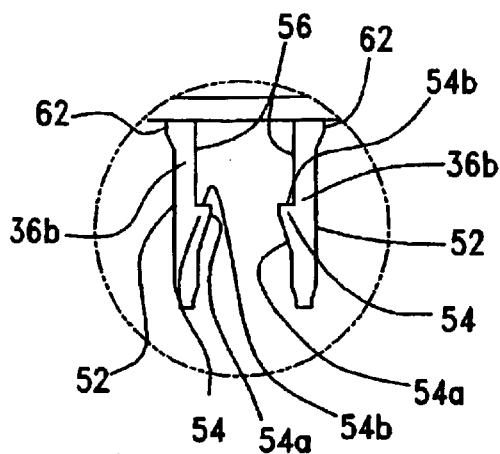
FIG. 5 is an enlarged elevational view of the area indicated by circle "5" in FIG. 2.

Referring to FIG. 5 in conjunction with FIG. 1, each tail portion 36b of each solder tail 36 includes a first side 52 and a latch hook 54 projecting from a second side 56 opposite first side 52. Each latch hook 54 includes an angled leading surface 54a for guiding the respective tail portion into a selected through hole 50 in circuit board 40. An abrupt latch surface 54b is behind angled leading surface 54a for engaging bottom or rear side 40b of the circuit board. Each latch hook 54 has a tip 54c.

Figure 6:
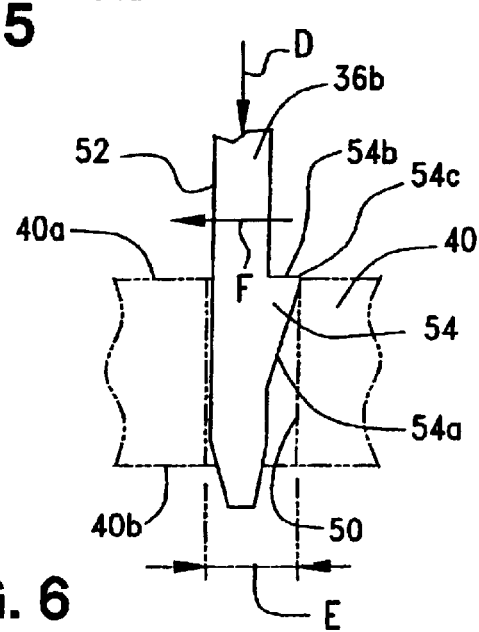
FIG. 6 is an enlarged, fragmented vertical section through one of the through holes in the circuit board, showing the solder tail portion of one of the terminals being inserted into the hole.

FIG. 6 shows one of the tail portions 36b being inserted in the direction of arrow "D" in a respective one of the through holes 50 in circuit board 40. It should be noted that the width of tail portion 36b between first side 52 and a tip 54c of latch hook 54 is slightly less than the diameter or width "E" of through hole 50. Therefore, the solder tail portion can be inserted from top or front side 40a of the printed circuit board into the hole with minimum insertion forces. During insertion, angled leading surface 54a of latch hook 54 may bias tail portion 36b in a horizontal direction as indicated by arrow "F" for the solder tail portion to be inserted easily into and through hole 50.

Figure 7:
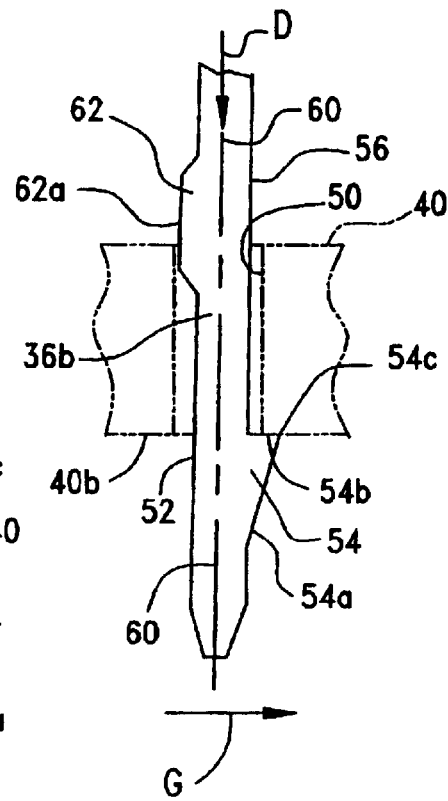
FIG. 7 is a view similar to that of FIG. 6, with the solder tail portion fully inserted through the hole and latched to the back side of the circuit board.
Figure 8:
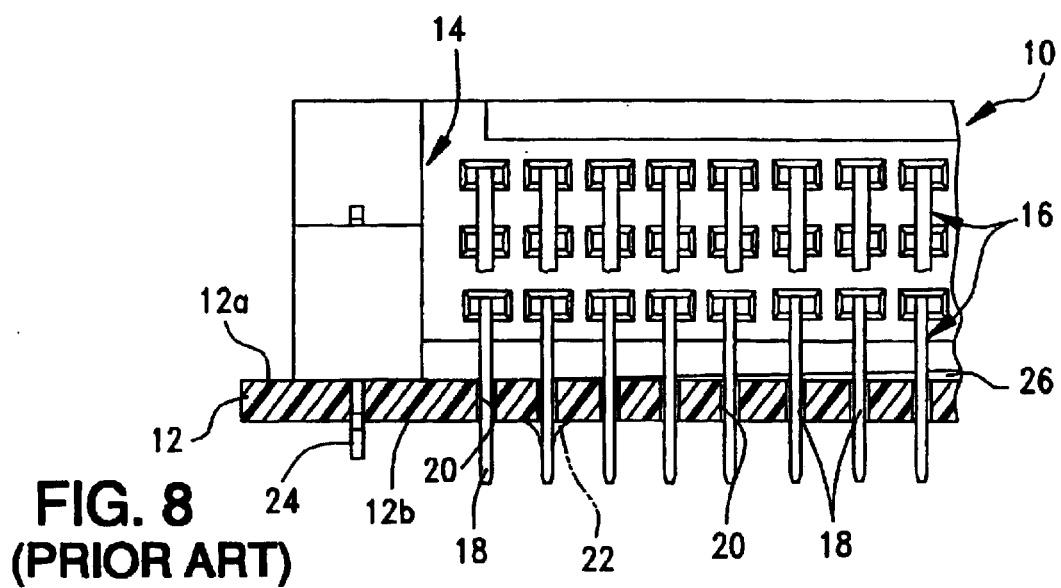
FIG. 8 is a fragmented rear elevational view of a board mounted connector according to the prior art and as described in the "Background", above.

FIG. 7 shows tail portion 36b fully inserted through hole 50 in the direction of arrow "D". Once the solder tail portion is fully inserted, latch surface 54b of latch hook 54 clears the bottom or back side 40b of circuit board 40, whereupon the solder tail portion and latch hook move in the direction of arrow "G" into engagement with back side 40b of the circuit board, as shown. It should be understood that the invention contemplates that terminals 34 be mounted in housing 32 so that a center-line 60 (FIG. 7) of the solder tail portion, in its unstressed condition, coincides with a center-line of the respective through hole 50. This can be accomplished by relative positioning of hold-down members 42 on circuit board 40. Center-line 60 is equidistant between opposite sides 52 and 56 of the solder tail portion. In other words, when the solder tail portion is inserted into the hole as described above in relation to FIG. 6, angled leading surface 54a biases the solder tail portion in the direction of arrow "F" (FIG. 6) moving the center-line of the solder tail portion off-center relative to the center-line of the through hole as seen in FIG. 6. When abrupt latch surface 54b clears rear side 40b of the circuit board, the self-resiliency of the solder tail portion causes the latch hook to move into latching engagement with the back side of the circuit board, i.e., center-line 60 of the solder tail portion now moves back into registry with or across the center-line of the through hole.

However, the invention contemplates a unique feature wherein a biasing projection 62 (FIG. 7) extends outwardly from first side 52 of the solder tail portion and defines a biasing surface 62a which engages the adjacent side of through hole 50. Therefore, whether or not solder portion 36b moves in the direction of arrow "G" under the self-resiliency of its metal material, biasing projecting 62 is effective to move latch hook 54 into latching position beneath the bottom or back side 40b of the circuit board as seen in FIG. 7.

Finally, referring back to FIG. 5, it can be seen that the two solder tail portions 36b shown therein have their respective latch hooks 54 facing or directed toward each other. In the illustrated embodiment, these two solder tail portions are in a single row, i.e., row "A" in FIG. 1. This orientation of the latch hooks further ensures that there will be engagement of at least some of the latch hooks with the bottom or back side of the printed circuit board.

It will be understood that the invention may be embodied in other specific forms without departing from the spirit or central characteristics thereof. The present examples and embodiments, therefore, are to be considered in all respects as illustrative and not restrictive, and the invention is not to be limited to the details given herein.

What is claimed is:

1. An electrical connector for mounting on a printed circuit board having a plurality of through holes, comprising:

a dielectric housing;

a plurality of conductive terminals mounted on the housing, each terminal including a tail portion for passing through a selected one of the through holes in the printed circuit board in an insertion direction, each tail portion having a first side and a latch hook projecting from a second side opposite the first side, the width of the tail portion between said first side and a tip of the latch hook being less than a diameter of the selected through bole, and biasing projections, each having a straight biasing surface parallel to said insertion direction, at said first sides of the terminals, the biasing projections being spaced from the latch hooks, the biasing surfaces engaging the insides of the through holes, biasing the latch hooks into engagement with the opposite side of the printed circuit board when the latch hooks clear the through holes, and, with an opposed biasing surface from another tail portion, gripping the printed circuit board preventing lateral movement of the housing in relation to the printed circuit board;

whereby each tail portion can be inserted from one side of the printed circuit board through the selected through hole with minimum insertion forces, with the latch hook being engageable with an opposite side of the printed circuit board.

2. The electrical connector of claim 1 wherein said latch hook has an angled leading surface for guiding the respective tail portion into the selected through hole, and an abrupt latch surface behind the angled leading surface for engaging the opposite side of the printed circuit board.

3. The electrical connector of claim 1 wherein a given pair of said terminals have tail portions with latch hooks directed toward each other.

4. An electrical connector for mounting on a printed circuit board having a plurality of through holes, comprising:

a dielectric housing;

a plurality of conductive terminals mounted on the housing, each terminal including a tail portion for passing through a selected one of the through holes in the printed circuit board in an insertion direction, each tail portion having a first side and a latch hook projecting from a second side opposite the first side, each latch hook having an angled leading surface for guiding the respective tail portion into the selected through hole, the width of the tail portion between said first side and a tip of the latch hook being less than a diameter of the selected through hole, and a biasing projection, each having a straight biasing surface parallel to said insertion direction, at said first side of the tail portion spaced from the latch hook, the biasing surfaces engaging the inside of the through hole and biasing the latch hook into engagement with the opposite side of the printed circuit board when the latch hook clears the through hole, and, with an opposed biasing surface from another tail portion, gripping the printed circuit board preventing lateral movement of the housing in relation to the printed circuit board.

5. The electrical connector of claim 4 wherein a given pair of said terminals have tail portions with latch hooks directed toward each other.

* * * * *